United States Patent
Lavoie et al.

(10) Patent No.: US 7,550,385 B2
(45) Date of Patent: Jun. 23, 2009

(54) AMINE-FREE DEPOSITION OF METAL-NITRIDE FILMS

(75) Inventors: Adrien R. Lavoie, St. Helens, OR (US); Valery M. Dubin, Portland, OR (US); Juan E. Dominguez, Hillsboro, OR (US); Kevin P. O'Brien, Portland, OR (US); Steven W. Johnston, Portland, OR (US); John D. Peck, West Seneca, NY (US); David M. Thompson, East Amherst, NY (US); David W. Peters, Tonawanda, NY (US)

(73) Assignee: Intel Corporation, Santaclara, CA (US)

( * ) Notice: Subject to any disclaimer, the term of this patent is extended or adjusted under 35 U.S.C. 154(b) by 187 days.

(21) Appl. No.: 11/240,005

(22) Filed: Sep. 30, 2005

(65) Prior Publication Data

US 2007/0075427 A1     Apr. 5, 2007

(51) Int. Cl.
    H01L 21/44     (2006.01)
(52) U.S. Cl. ............. 438/681; 438/627; 438/648; 438/656; 257/E21.168; 427/249.17
(58) Field of Classification Search ......... 438/627–628, 438/679–681, 648, 656; 427/249.1, 249.17; 257/E21.168
    See application file for complete search history.

(56) References Cited

U.S. PATENT DOCUMENTS

| | | | |
|---|---|---|---|
| 3,288,829 A | 11/1966 | Wilkinson | |
| 6,015,917 A | 1/2000 | Bhandari et al. | |
| 6,337,151 B1 | 1/2002 | Uzoh et al. | |
| 6,428,859 B1 * | 8/2002 | Chiang et al. | 427/457 |
| 2004/0009307 A1 * | 1/2004 | Koh et al. | 427/569 |
| 2004/0256351 A1 | 12/2004 | Chung et al. | |
| 2005/0181555 A1 | 8/2005 | Haukka et al. | |

(Continued)

FOREIGN PATENT DOCUMENTS

WO    WO 01/66832 A2    9/2001

(Continued)

OTHER PUBLICATIONS

Wang S J et al.: "Influence of Nitrogen Doping on the Barrier Prperties of Sputtered Tantalum Carbide Films for Copper Metallization", Japanese Journal of Applied Physics, Japan Society of Applied Physics, Tokyo, JP, vol. 40, No. 11, Part 1, Nov. 2001, pp. 6212-6220, XP001089366.

(Continued)

*Primary Examiner*—Thanhha Pham
(74) *Attorney, Agent, or Firm*—Rahul D. Engineer

(57) ABSTRACT

A method for forming a metal carbide layer begins with providing a substrate, an organometallic precursor material, at least one doping agent such as nitrogen, and a plasma such as a hydrogen plasma. The substrate is placed within a reaction chamber; and heated. A process cycle is then performed, where the process cycle includes pulsing the organometallic precursor material into the reaction chamber, pulsing the doping agent into the reaction chamber, and pulsing the plasma into the reaction chamber, such that the organometallic precursor material, the doping agent, and the plasma react at the surface of the substrate to form a metal carbide layer. The process cycles can be repeated and varied to form a graded metal carbide layer.

10 Claims, 5 Drawing Sheets

U.S. PATENT DOCUMENTS

2006/0223300 A1* 10/2006 Simka et al. ................ 438/618
2007/0054046 A1* 3/2007 Ishizaka et al. .......... 427/248.1

FOREIGN PATENT DOCUMENTS

WO      WO 01/99166 A    12/2001

OTHER PUBLICATIONS

PCT International Search Report and Written Opinion of the International Searching Authority, Application No. PCT/US2006/037578, mailed Feb. 1, 2007.

U.S. Appl. No. 11/173,858; Title: Post Polish Anneal of Atomic Layer Deposition Barrier Layers; Inventor: Steven W. Johnston; filed Jun. 30, 2005.

U.S. Appl. No. 11/096,860; Title: Organometallic Precursors for the Chemical Phase Deposition of Metal Films in Interconnect Applications; Inventor: Harsono Simka; filed Mar. 31, 2005.

* cited by examiner

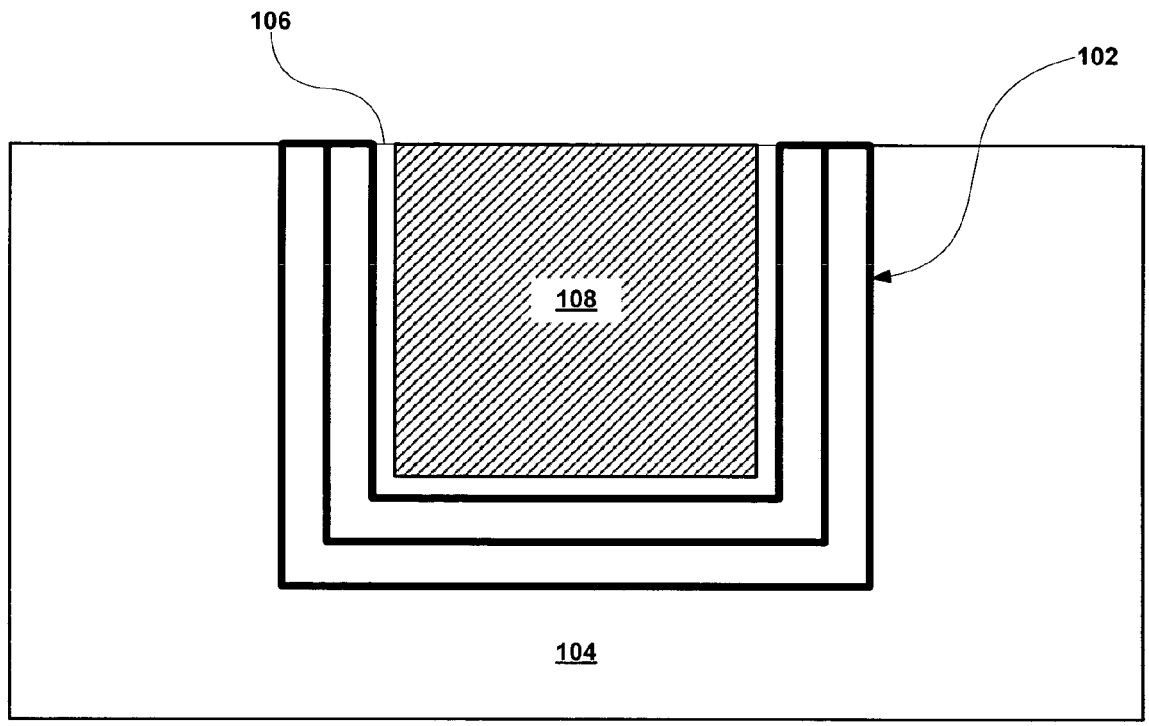
Fig_1

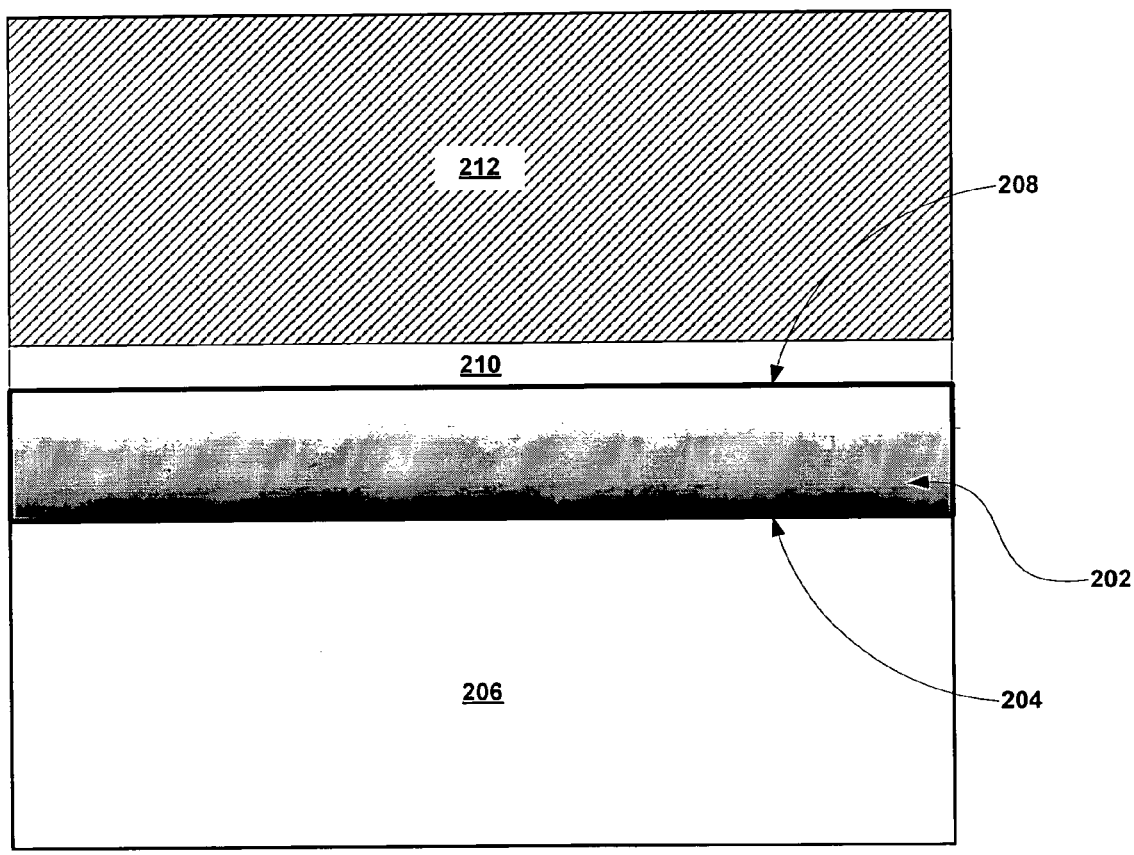
Fig_2

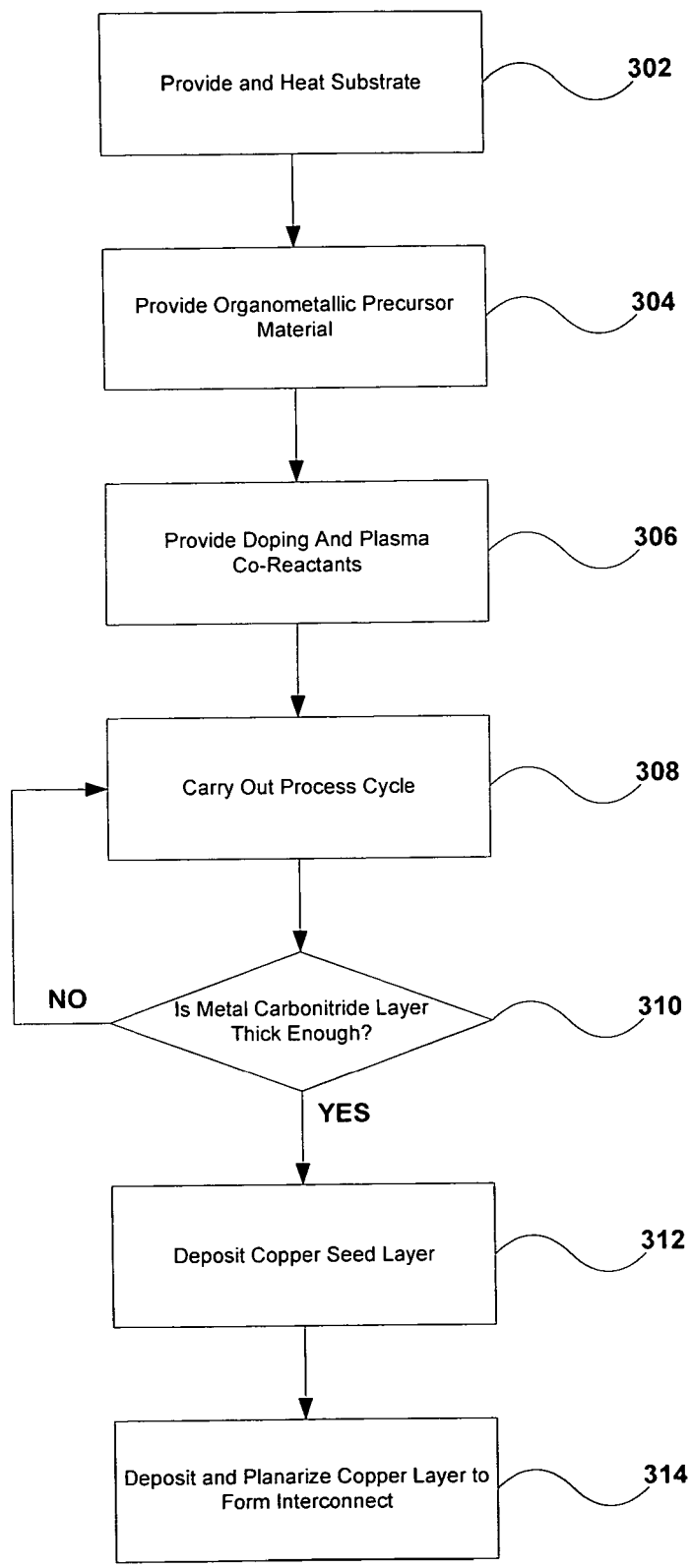
Fig_3

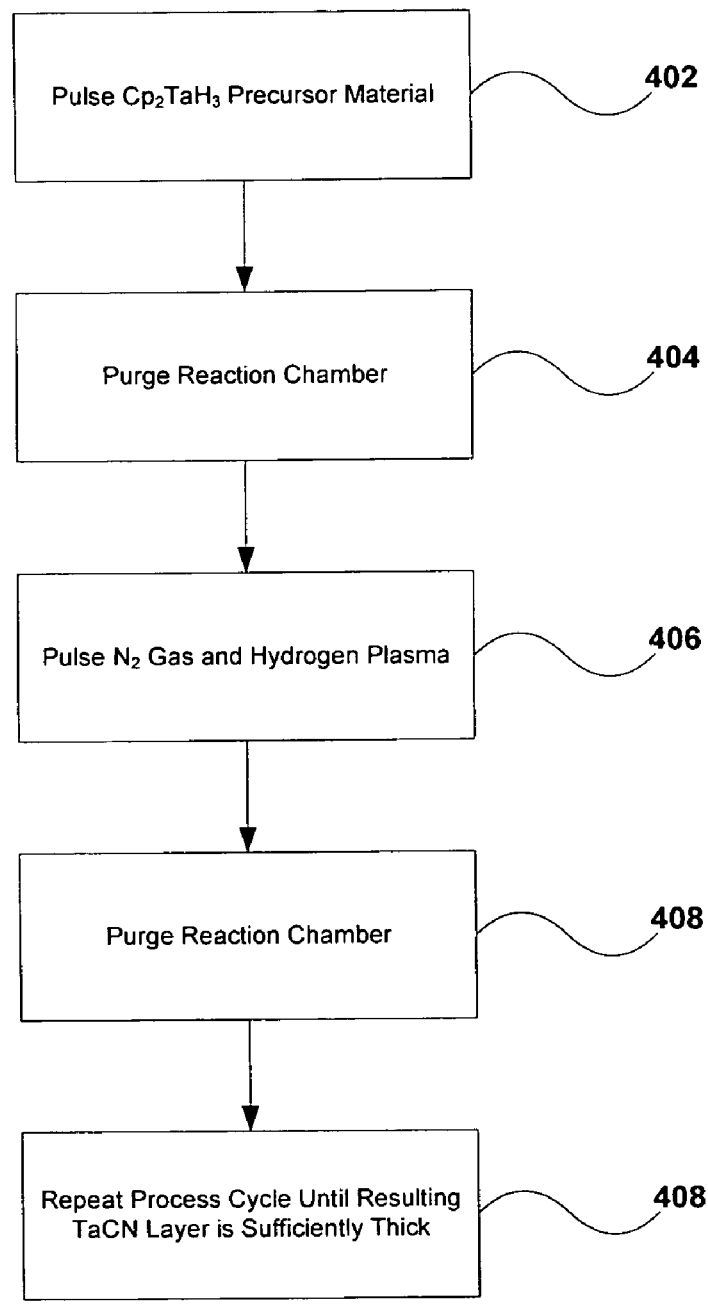
Fig_4

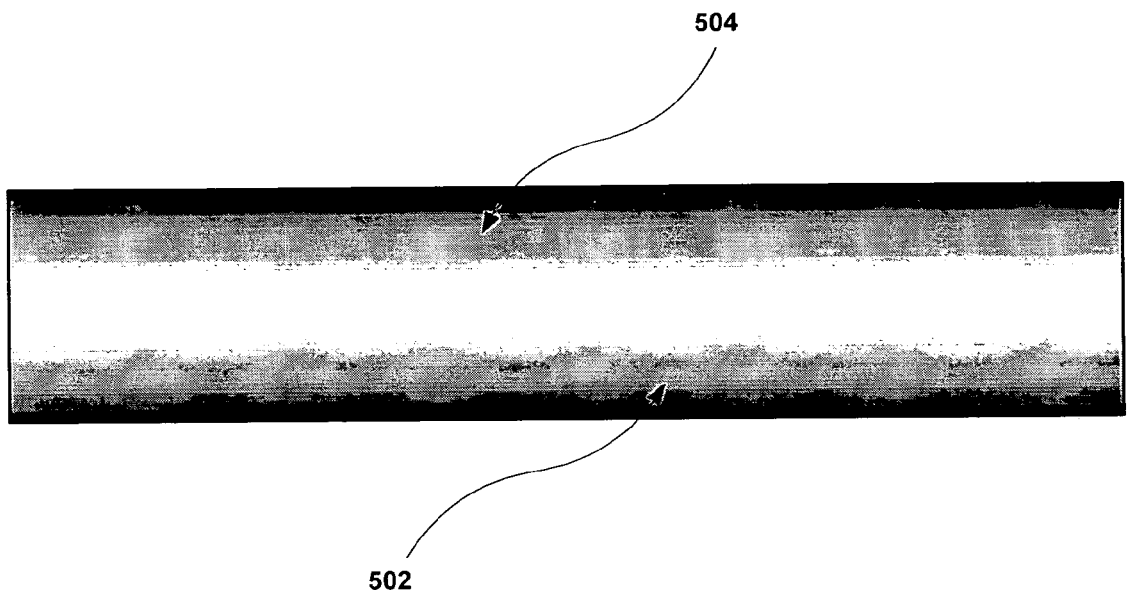
Fig_5

AMINE-FREE DEPOSITION OF METAL-NITRIDE FILMS

BACKGROUND

In the manufacture of integrated circuits, copper metal interconnects are generally used to couple various electronic devices such as transistors and capacitors. Copper interconnects are often formed using a damascene process whereby a dielectric layer is etched to form a trench into which the copper metal is deposited. The copper deposition is typically followed by a chemical mechanical polishing step to planarize the interconnect and remove excess material.

Prior to the copper metal deposition, a barrier layer, an adhesion layer, and a seed layer must be deposited into the trench in the dielectric layer. The barrier layer prevents the copper metal from diffusing into the dielectric layer. The adhesion layer binds the barrier to the seed. The seed layer provides a surface that enables the copper metal to deposit and adhere within the trench. Metal nitride films, such as tantalum nitride (TaN), may be used to form the barrier layer, while metal layers, such as a tantalum layer (Ta), may be used to provide the adhesion layer for the copper seed layer. As is well known in the art, a TaN/Ta stack is usually deposited into the trench prior to the copper metal. In some applications, a pure Ta layer may be used to provide the barrier and adhesion functionality.

Current chemical vapor deposition (CVD) and atomic layer deposition (ALD) methods for generating a barrier layer and an adhesion layer suffer from many drawbacks. Conventional methods to generate a metal nitride barrier layer employ precursor functionalities that contain problematic amine or imine compounds.

Conventional methods for generating barrier and adhesion layers involve two separate layers, such as the TaN/Ta stack 100 shown in FIG. 1. The TaN/Ta stack 100 typically lines a trench 102 within a dielectric layer 104. Within the trench 102 and atop the TaN/Ta stack 100 are a seed layer 106 and a copper metal interconnect 108. As interconnect widths are scaled down and the trenches 102 become narrower, the stacked TaN/Ta layers 100 will occupy more of the volume within the trench 102. This leaves less room for the seed layer 106 and the copper metal interconnect 108. A point will be reached where there will no longer be sufficient room for the copper metal to be deposited. Thinner barrier and adhesion layers are needed to continue the scaling down of integrated circuit dimensions. Unfortunately, the materials currently used for ALD deposited barrier layers and adhesion layers, such as the TaN/Ta stack 100, may not be extendable due to the previously discussed photolithography implications.

Current methods of forming barrier layers also suffer from other problems. High resistivity interfacial layers such as tantalum oxide may result from known processes. Current methods also make use of corrosive precursors and/or by-products such as halides that can complicate tool design and increases costs. Accordingly, processes are needed to form barrier and adhesion layers that may be used in scaled down integrated circuits without the shortcomings highlighted above.

BRIEF DESCRIPTION OF THE DRAWINGS

FIG. 1 is a conventional interconnect structure using a TaN/Ta stack.

FIG. 2 is a graded TaCN layer constructed in accordance with an implementation of the invention.

FIG. 3 is a method for generating a TaCN layer in accordance with an implementation of the invention.

FIG. 4 is a specific process cycle for generating a TaCN layer in accordance with an implementation of the invention.

FIG. 5 is an alloyed carbonitride layer constructed in accordance with an implementation of the invention.

DETAILED DESCRIPTION

Described herein are systems and methods of forming an amine-free barrier and adhesion layer. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Implementations of the invention provide methods for producing a metal and carbon containing layer, such as a metal, carbon, and nitrogen containing layer referred to herein as a metal carbonitride layer, that provides the functionality of both a barrier layer and an adhesion layer. As interconnect widths are scaled down, the use of a single layer to function as both a barrier and adhesion layer provides more room for copper metal to be deposited and form an interconnect structure. Scaled down circuit dimensions previously unattainable due to the limiting thickness of the stacked barrier layer and adhesion layers may be achieved with the use of a single metal carbonitride layer.

In one implementation of the invention, the metal and carbon containing layer may be a metal carbonitride layer such as tantalum carbonitride ($Ta_xC_yN_z$ or TaCN). The concentration of carbon (C) and nitrogen (N) may be varied depending on the requirements of the layer. In implementations of the invention, the metal carbonitride layer may be a graded or laminated layer. For instance, a concentration gradient may exist within the layer for the carbon and/or the nitrogen.

FIG. 2 illustrates one implementation of a TaCN layer 200 where the concentration of carbon and nitrogen is graded. In implementations of the invention, the TaCN layer 200 may have a thickness that ranges from 5 Angstroms (Å) to 50 Å, with the typical thickness being around 10 Å to 30 Å. When deposited using the methods described below, the TaCN layer 200 is generally a conformal, continuous, dense, and uniform layer. The TaCN layer 200, in implementations of the invention, has low film impurities, is halide-free, and promotes good adhesion to previous and subsequent metal or other layers. The TaCN layer 200 may also have good thermal barrier integrity, such as being able to withstand temperatures up to 400° C. for four hours or longer.

The graded concentration of carbon and nitrogen, shown as a shaded region 202, is, for example, highest at a first surface 204 of the TaCN layer 200 where the TaCN layer 200 interfaces with a dielectric layer 206. The high concentration of carbon and nitrogen in the TaCN layer 200 at the surface 204 provides barrier layer functionality to prevent copper metal from diffusing into the dielectric layer 206. In an implementation, the graded concentration of carbon and nitrogen decreases across the thickness of the TaCN layer 200 until it is lowest at a second surface 208 of the TaCN layer 200. In some implementations, the concentration may be substantially zero at this second surface 208. The TaCN layer 200 has an increased tantalum concentration at this second surface 208 and provides adhesion layer functionality to allow a metal layer 210, such as a metal seed layer, to become deposited atop the TaCN layer 200. A metal interconnect 212, such as a copper interconnect, may then be formed atop the metal layer 210. In one implementation, the morphology of the TaCN layer 200 may be amorphous at the first surface 204 adjacent to the dielectric layer 206 and may be polycrystaline at the second surface 208 adjacent to the metal layer 210.

Use of the graded TaCN layer 200 therefore enables the deposition of a single layer that provides both barrier layer functionality and adhesion layer functionality without the need for volume consuming stacked TaN/Ta layers. Having a single layer that performs both functions will enable further interconnect scaling by providing more margin for copper gapfill to form the actual interconnect structure.

In various implementations of the invention, the concentration gradients of carbon and nitrogen may be adjusted depending on the needs of the process and the function of the TaCN layer 200. In some implementations, the concentration gradient for the carbon may be different than the concentration gradient of the nitrogen. In alternate implementations, the concentration of carbon and nitrogen in the TaCN layer 200 may be laminated, such that the TaCN layer 200 consists of nanosized films stacked in a vertical manner.

In further implementations of the invention, metal carbonitride layers other than tantalum carbonitride may be used. It should be noted here that the term "metal carbonitride" may be used interchangeably with metals containing carbon and nitrogen that may or may not be stable under all processing conditions. For instance, metal carbonitride materials that may be used in implementations of the invention include, but are not limited to, titanium carbonitride (TiCN), tungsten carbonitride (WCN), ruthenium carbonitride (RuCN), and niobium carbonitride (NbCN). In implementations of the invention, metals that may be doped with carbon and nitrogen to form metal carbonitride layers include, but are not limited to, titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), zinc (Zn), cadmium (Cd), gallium (Ga), and lanthanum (La). Transition metals and their alloys have a wide range of conductivities, depending on the type of dopants and their respective concentrations, resulting in a potential variety of applications when deposited in accordance with implementations of the invention.

In some implementations, one or more of these metals may be co-deposited to form a metal-alloy, graded or laminated, carbonitride layer. The use of an alloyed layer may reduce or limit copper electromigration along the outer surfaces of the copper interconnects.

In another implementation of the invention, the nitrogen may be omitted and a metal and carbon containing layer, such as a metal carbide layer, may be used to provide a single layer having barrier layer and adhesion layer functionality. In one implementation, the metal carbide layer may be a tantalum carbide (TaC) layer. As with the TaCN layer 200, the TaC layer may be a graded or laminated layer having a carbon concentration that is varied across the thickness of the layer. In one implementation, the TaC layer may have a relatively higher concentration of carbon at a first surface that interfaces with a dielectric layer to provide barrier layer functionality. The TaC layer may also have a relatively lower concentration of carbon at a second surface that interfaces with a metal seed layer to provide adhesion layer functionality. The morphology of the TaC layer may be amorphous at the first surface adjacent to the dielectric layer and may be polycrystalline at the second surface adjacent to the metal layer.

In further implementations of the invention, metal carbide layers other than tantalum carbide may be used. For instance, metal carbide materials that may be used in implementations of the invention include, but are not limited to, titanium carbide (TiC), tungsten carbide (WC), ruthenium carbide (RuC), and niobium carbide (NbC). In implementations of the invention, metals that may be doped with carbon to form metal and carbon containing layers include, but are not limited to, Ti, Zr, Hf, V, Nb, Ta, Cr, Mo, W, Mn, Re, Fe, Ru, Os, Co, Rh, Ir, Ni, Pd, Pt, Cu, Ag, Au, Zn, Cd, Ga, and La. In some implementations, one or more of these metals may be co-deposited to form a metal-alloy carbide layer.

In accordance with implementations of the invention, the metal carbonitride layer, such as TaCN layer 200, may be generated by a deposition process that does not utilize amine or imine containing materials. The exclusion of amine and/or imine compounds eliminates the conventional problem of out-gassing of the amines or imines that often poisons photoresist layers in subsequent processing steps.

FIG. 3 is a method 300 for generating a TaCN layer in accordance with an implementation of the invention. First, a substrate is provided and heated within a reaction chamber (302). The substrate may include, but is not limited to, a semiconductor wafer having at least one dielectric layer deposited on its surface. The dielectric layer may include one or more trenches and/or vias within which the TaCN layer will be deposited and the copper interconnect will be formed. In implementations of the invention, the substrate may be heated to a temperature that ranges from 200° C. to 400° C., and is more generally heated to a temperature that ranges from 330° C. to 350° C.

A precursor material chosen for its ability to form a TaCN layer is provided (304). In one implementation, the precursor material may be an organometallic precursor material that includes tantalum (Ta), hydrogen (H), and cyclopentadienyl (Cp). For example, in an implementation, the precursor material may be $Cp_2TaH_3$, also known as tantalocene trihydride. In other implementations, organometallic precursors other than $Cp_2TaH_3$ may be used to form TaCN layers or alternate metal carbonitride layers. Examples of such metal organic precursors are described below.

In addition to the precursor material, co-reactants consisting of a doping agent and a plasma are also provided (306). In implementations of the invention, the co-reactants may include nitrogen gas ($N_2$) or another non-amine reactive gas as the doping agent and a plasma containing hydrogen, argon, helium, or combinations of the above.

Next, a process cycle is carried out in which the precursor material and the co-reactants are applied to the surface of the substrate to react and form a TaCN film that forms a portion of the final TaCN layer (308). The process cycle may introduce the precursor material and the co-reactants into the reaction chamber in discrete pulses or in a continuous manner, depending on the desired properties of the final TaCN layer. If pulses are used, the precursor material pulse and the co-reactant pulse may be alternated. Purging processes may be used in between pulses to clear out the reaction chamber. The pressure within the reaction chamber during the process cycle may range from 1 mTorr to 1000 Torr.

The precursor material, such as $Cp_2TaH_3$, may be introduced to the reaction chamber through a vapor deposition process. The vaporizer temperature may be around 90° C. and argon may be used as a carrier gas. In various implementations of the invention, the vapor deposition process may be an atomic layer deposition (ALD) process or a chemical vapor deposition (CVD) process that will yield a conformal layer.

In one implementation, a plasma discharge may be developed using a 13.56 MHz RF power generator. Other RF frequencies and/or modes of plasma generation may also be effective. For instance, in implementations of the invention, a plasma source such as a radio frequency source, a direct current source, a pulsed direct current source, a capacitatively coupled source, or a microwave source may be used. The plasma discharge may be operated either remotely or directly. In an implementation using a direct capacitively coupled plasma, the reactor may use a parallel plate configuration. Using this configuration, the plasma may be operated with a power density from 0.01 $W/cm^2$ to 10 $W/cm^2$. The optimum power density may be selected based on the process performance and film properties.

In implementations of the invention, the process cycle may introduce the co-reactants in separate pulses or in simultaneous pulses. In other implementations, some co-reactant pulses may separate the co-reactants while other co-reactant pulses may combine the co-reactants. For instance, the $N_2$ gas may be introduced both with and without the hydrogen plasma to instill certain physical properties in the final TaCN layer. Accordingly, some pulses may contain $N_2$ gas alone while other pulses may contain both $N_2$ gas and plasma. Some pulses may contain only plasma as well. Plasmas composed of other species may be used as well. It should be noted that any process steps in which a plasma is pulsed into the reaction chamber may alternately consist of pulsing the plasma after the plasma has already been introduced inside the chamber.

Under the conditions described, the precursor material and the co-reactants tend to react and form a TaCN film atop the substrate surface. Although the deposited TaCN film will be relatively thin, the film will have highly conformal coverage given that the precursor deposition occurs through a CVD or ALD process. Multiple process cycles are carried out to deposit several films and build up a TaCN layer of a desired thickness (310).

In implementations of the invention, the process parameters for each individual process cycle may be varied to change the composition of the TaCN layer across its thickness. For instance, changing the parameters of each individual process cycle, or groups of successive process cycles, may be used to generate a TaCN layer that is graded and/or has certain desired physical properties. Such physical properties include, but are not limited to, tailored carbon and nitrogen concentrations as well as carbon and/or nitrogen gradients within the TaCN layer. The use of carbon and nitrogen doping may also be utilized to disrupt the long range order in the crystal and result in amorphous films and increase the crystallization temperature of the doped metal. Process parameters that may be manipulated include, but are not limited to, the number of pulses of precursor material and/or co-reactants in each process cycle, the sequence of the pulses, the length of each pulse, the $N_2$, Ar, or He gas concentration with and/or without the plasma, the plasma pulse duration, the plasma load, the precursor material concentration and flow rate, the $N_2$, Ar, or He gas flow rate, the substrate temperature, and the pressure within the reaction chamber.

Accordingly, a graded TaCN layer may be formed by manipulating the process parameters of an initial set of process cycles to deposit carbon and nitrogen rich TaCN films adjacent to the substrate. The process parameters of a subsequent set of process cycles may be manipulated to deposit TaCN films that have a reduced concentration of carbon and nitrogen relative to the initial films. The process parameters of a final set of process cycles may be manipulated to deposit films that are substantially tantalum with little or no carbon and nitrogen. The final result is a graded TaCN layer having barrier layer functionality adjacent to the substrate and adhesion layer functionality adjacent to a subsequently deposited seed layer, similar to the TaCN layer 200 shown in FIG. 2.

In other implementations, the precursor material and co-reactants may be applied in a simultaneous manner to produce a different set of physical properties and gradients in the TaCN layer. In some implementations, a combination of alternating pulses and simultaneous applications may be used.

After the TaCN layer has been formed, a copper seed layer may be formed atop the TaCN layer (312). The copper seed layer may be formed using conventional deposition processes such as sputtering processes. In some implementations, the copper seed layer may not be necessary. Finally, copper may be deposited atop the copper seed layer to form the interconnect structure (314). Conventional processes to deposit copper may be used, including but not limited to electroless plating, electroplating, PVD, CVD, or ALD methods. A chemical mechanical polishing process may be used after the deposition process to planarize the deposited copper, allowing for the formation of the interconnect structure.

The method described above in FIG. 3 is an amine-free and imine-free process for forming a TaCN layer. Implementations of the invention therefore enable the deposition of metal carbonitride layers with tailored carbon and nitrogen concentrations. As shown, in lieu of amine or imine compounds, the methods of the invention utilize nitrogen-free metal organic compounds, nitrogen, and a plasma source including, but not limited to, hydrogen and argon plasmas.

FIG. 4 illustrates one implementation of a specific process cycle 400 to form a TaCN layer in accordance with the invention. In this implementation, the $Cp_2TaH_3$ precursor material and the $N_2$ gas and hydrogen plasma may be applied in an alternating manner. As shown, the process cycle begins with a 10 second pulse of the process gas mixture containing the $Cp_2TaH_3$ precursor (402). The precursor may be vaporized using 100 sccm of argon at 50 Torr and 90° C. At these conditions, the estimated flow of the precursor is between 0.01 sccm and 0.1 sccm. Next, the reaction chamber may be purged for 20 seconds (404). The reaction chamber may be purged using a non-reactive gas such as argon. The purge is followed by a 10 second pulse of the $N_2$ gas and hydrogen plasma (406). Finally, the reaction chamber is purged again for 20 seconds (408). This process cycle 400 yields a TaCN layer growth rate of approximately 0.5 Å per minute and the process cycle 400 may be repeated until the resulting TaCN layer is sufficiently thick (410). In some implementations, the process cycle 400 is repeated 40 to 60 times to generate TaCN layers of sufficient thickness. It should be noted that the process of FIG. 4 is only one implementation of the invention and it will be readily apparent to those of skill in the art that the process steps may be varied, for instance, the pulse time durations are subject to increase or decrease, depending on the deposition equipment and precursors used.

It should be noted that in implementations of the invention, any steps in which a plasma is pulsed into the reaction chamber may alternately consist of pulsing the plasma after the plasma has already been introduced inside the chamber.

In alternate implementations of the invention, grading of the Ta or other metal concentration may be done by changing (i.e., increasing or decreasing) parameters such as the plasma pulsing frequency, load, and/or plasma duration. For instance, a TaC film may be generated by using either an Ar or He plasma with the amine free precursor. Furthermore, a TaCN film may be generated by using a combination of $N_2$, Ta-precursor, and plasma.

In further implementations of the invention, organometallic precursor materials may include materials that combine a metal, such as tantalum, with organic ligands, including but not limited to methyl (Me), ethyl (Et), propyl (Pr), normal or linear propyl (nPr), isopropyl (iPr), butyl (Bu), t-butyl (tBu), sec-butyl (sBu), isobutyl (iBu), normal or linear butyl (nBu), phenyl (Ph), diethylene glycol dimethyl ether (Diglyme or Glyme), carbonyl (CO), tetrahydrofuran (THF), cyclohexyl (Cy), cyclopentadienyl (Cp), functionalized cyclopentadienyl (Cp*) (e.g., $Me_5Cp$), any functionalized cyclopentadienyl moiety (Cp') (e.g., MeCp or $Me_5Cp$), pyridine (Py), other cyclic and non-cyclic dienyl compounds (e.g., 1,3-cycloheptadienyl, 2,4-dimethyl-1,3-pentadienyl), and 1,2-bis (dimethylphosphino)ethane (Dmpe). The organometallic precursor materials may also contain elements that include, but are not limited to, phosphorus (P), arsine (As), chlorine (Cl), iodine (I), and sodium (Na).

Examples of specific organometallic precursor materials that may be used in implementations of the invention include, but are not limited to: $Cp_2TaH_3$; $CpTa(CO)_4$; $(MeCp)Ta(CO)_4$; $CpTa(CO)_3(R)$, where R is $PPh_3$, $AsPh_3$, or any other neutral 2 electron donor; $CpTa(CO)_3(R)$, where R is THF, $PPh_3$, $PCy_3$, or any other neutral 2 electron donor; $CpTa(CO)_2(C_5H_5)$; $Cp_2TaH(CO)$; $Cp_2TaR(CO)$, where R is Me, $CH_2Ph$, Ph, or any other negatively charged 2 electron donor; $Cp_2TaH(CH_2=CHR')$, where R' is H, Me, Et, Pr, or Ph; $Cp_2Ta(CH_2CH_2R')(CNR)$, where R and R' are each independently chosen from H, Me, Et, Pr, Ph, or any other negatively charged 2 electron donor; $CpTaXMe(CHCMe_3)$, where X is Cl, Me, or any other negatively charged 2 electron donor; $Cp'TaX(CH_2Ph)(CHPh)$, where Cp' is $C_5H_4Me$, $C_5Me_5$, or any other functionalized cyclopentadienyl ligand, and where X is Cl, $CH_2Ph$, or any other negatively charged 2 electron donor; $Cp*Ta(PMe_3)(C_2H_4)(CHCMe_3)$; $Cp_2TaMe(CH_2)$; $Cp(MeCp)TaMe(CH_2)$; $Cp_2TaMe(CHR)$, where R is H, Me, Ph, $SiMe_3$, or any other negatively charged 2 electron donor; $Cp_2Ta(CHPh_2)(CHCMe_3)$; $Cp_2Ta(CH_2Ph)(CHPh)$; $Cp*TaMe_3Ph$; $Cp*TaMe_2(Me_2CO)$; $Cp*TaMe_2(C_2H_4)$; $Cp_2TaMe_3$; $Cp_2TaPh_2$; $Cp*TaMe_4$; $Cp_2Ta(Cp)_2$; $Cp'Me_2Ta$ (indenyl); $Cp_2TaH(CH_2=CHR)$, where R is Me, Et, nPr, or any other negatively charged 2 electron donor; $Cp_2Ta(cyclopentene)$; $Cp_2Ta(benzyl)(CHPh)$; $Cp_2ClTaCH(tBu)$; $CpTa(CH(tBu)X(PMe_3)_2$, where X is H, Me, Et, Pr, halide, or Ph; $Cp_2TaMe(C_2H_4)$; $CH_2=Ta(Cp)_2CH_3$; $Cp_2Ta(nPr)(C_8H_8)$; $CpTa(CO)_x(PhCCPh)$, where x equals 1 or 2; $Cp_2Ta(allyl)$; $Cp_2Ta(methallyl)$; $Cp'TaH_3$; $Cp_2TaH(CO)$; $Cp_2TaH(propene)$; $Cp_2TaMe_3$; $Cp*TaCO_4$; $Cp*TaMe_4$; $Cp_2Ta(nPr)(CNMe)$; $Cp*TaMe_2(benzene)$; $Cp*Ta(CHCMe_3)(ethene)PMe_3$; $Ta(CO)_3(C_7H_7)$; $Ta_2(CO)_{12}$; $TaH(CO)_2(Dmpe)_2$; $TaX(CO)_2[Me_2P(CH_2)_2PR_2]_2$, where X is Cl, I, or any other negatively charged 2 electron donor and R is Et, iPr, or any other negatively charged 2 electron donor; $(RHg)Ta(CO)_4$, where R is Et, Ph, or any other negatively charged 2 electron donor; $Ph_3SnTa(CO)_4$; $[(C_5H_4nBu)Ta(CO)_3\{Si(Cl_8H_{37})_2\}]_2$; $((CH_3)_3CCH_2)_3Ta=CHC(CH_3)_3$; $((R_{1a}CR_{2a}R_{3a})((R_{1b}CR_{2b}R_{3b})((R_{1c}CR_{2c}R_{3c})Ta=CR_4R_5$ where $R_n$ is H, Me, Et, iPr, nPr, tBu, sBu, iBu, nBu, amyl, F, Cl, Br, I, or any other negatively charged 2-electron donor; $Ta(allyl)_4$; $Ta(1-methylallyl)(C_4H_6)_2$; and $TaMe_5$. As previously mentioned, organometallic precursor materials similar to the ones mentioned above, but using metals other than tantalum, may be used as well.

In further implementations, a combination of metals or alloys may be used to form the metal carbonitride layer. For example, in one implementation, two different metals may be used to form a metal carbonitride layer, where one of the metals is better suited for barrier layer functionality and the other metal is better suited for adhesion layer functionality. Metals that include, but are not limited to, Ta, Ti, and W may be used in the metal carbonitride layer for barrier layer functionality, while metals that include, but are not limited to, Ru, Pt, Co, and Al may be used for adhesion layer functionality.

FIG. 5 illustrates such an alloyed carbonitride layer 500. The alloyed carbonitride layer 500 may have a gradient of a first metal 502, such as a metal better suited for barrier layer functionality, as well as a gradient of a second metal 504, such as a metal better suited for adhesion layer functionality. Accordingly, the concentration of the first metal 502 is highest at the surface adjacent the dielectric layer while the concentration of the second metal 504 is highest at the surface adjacent the seed layer. In some implementations, the concentration of each metal may be substantially zero at the surface where that metal is not necessary. In alternate implementations of the invention, the different metals may be deposited in laminates and used in as-deposited fashion or after a moderate-temperature anneal.

In implementations of the invention, an alloyed carbonitride layer may be formed using the methods described above to react two precursor materials with $N_2$ gas and a hydrogen or argon plasma. The two precursor materials may be two organometallic precursor materials that each contain at least one metal to be used in the alloyed carbonitride layer. In one implementation, precursor materials such as $Cp_2TaH_3$ and $Ru(CP)_2$ may be reacted with $N_2$ gas and an argon plasma to form an alloyed carbonitride layer having the composition $Ta_xRu_yC_zN_w$, where the values of x, y, z, and w may be modified through the process parameters such as the number of pulses of each reactant, the length of each reaction, the gas concentration with and without the plasma, and the plasma pulse duration.

The apparatus and methods described herein may be employed for any and all semiconductor processes that necessitate the use of metal carbonitride layers and metal and carbon containing layers. These applications include, but are not limited to, barrier materials for front and back-end applications such as copper diffusion barriers and metal gate/contact barriers.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. A method for forming an integrated circuit comprising:
providing a substrate;
providing an organometallic precursor material;
providing at least one doping agent;
providing a plasma;
placing the substrate within a reaction chamber;
performing a process cycle, wherein the process cycle comprises:
pulsing the organometallic precursor material into the reaction chamber;
pulsing the doping agent into the reaction chamber; and
pulsing the plasma into the reaction chamber,
wherein the organometallic precursor material, the doping agent, and the plasma react at the surface of the substrate to form a metal and carbon containing layer; and
repeating the process cycle until the metal and carbon containing layer is of a sufficient thickness, wherein a number of organometallic precursor material pulses, a number of doping agent pulses, and a number of plasma pulses are varied in consecutive process cycles to form a graded concentration of carbon in the metal and carbon containing layer.

2. The method of claim 1, wherein the substrate comprises a semiconductor wafer having a dielectric layer on its surface.

3. The method of claim 1, wherein the organometallic precursor material comprises $Cp_2TaH_3$.

4. The method of claim 1, wherein the doping agent comprises nitrogen gas ($N_2$) and the metal and carbon containing layer comprises a metal carbonitride layer.

5. The method of claim 1, wherein the pulsing of the organometallic precursor material into the reaction chamber comprises:
vaporizing the organometallic precursor material using a vapor deposition process; and
using a carrier gas to transport the vaporized organometallic precursor material into the reaction chamber.

6. The method of claim 1, wherein each process cycle includes a plurality of variable parameters, and at least one parameter of each process cycle is varied to form a graded metal and carbon containing layer.

7. The method of claim 6, wherein the variable parameters comprise a number of times the organometallic precursor material is pulsed into the reaction chamber, a number of times the plasma is pulsed into the reaction chamber, a number of times the doping agent is pulsed into the reaction chamber, a sequence of the pulses, an organometallic precursor material pulse duration, a doping agent pulse duration, a plasma pulse duration, an $N_2$, Ar, or He gas concentration with the plasma, an $N_2$, Ar, or He gas concentration without the plasma, a plasma power load, an organometallic precursor material concentration, an organometallic precursor material flow rate, an $N_2$, Ar, or He gas flow rate, and a pressure within the reaction chamber.

8. The method of claim 1, wherein a sequence of the organometallic precursor material pulses, the doping agent pulses, and the plasma pulses is varied in consecutive process cycles to form a graded concentration of carbon in the metal and carbon containing layer.

9. The method of claim 1, wherein the organometallic precursor material comprises $Cp_2TaH_3$; $CpTa(CO)_4$; (MeCp)Ta(CO)$_4$; $CpTa(CO)_3(R)$, where R is $PPh_3$, $AsPh_3$, or any other neutral 2 electron donor; $CpTa(CO)_3(R)$, where R is THF, $PPh_3$, $PCy_3$, or any other neutral 2 electron donor; $CpTa(CO)_2(C_5H_5)$; $Cp_2TaH(CO)$; $Cp_2TaR(CO)$, where R is Me, $CH_2Ph$, Ph, or any other negatively charged 2 electron donor; $Cp_2TaH(CH_2=CHR')$, where R' is H, Me, Et, Pr, or Ph; $Cp_2Ta(CH_2CH_2R')(CNR)$, where R and R' are each independently chosen from H, Me, Et, Pr, Ph, or any other negatively charged 2 electron donor; $CpTaXMe(CHCMe_3)$, where X is Cl, Me, or any other negatively charged 2 electron donor; $Cp'TaX(CH_2Ph)(CHPh)$, where Cp' is $C_5H_4Me$, $C_5Me_5$, or any other functionalized cyclopentadienyl ligand, and where X is Cl, $CH_2Ph$, or any other negatively charged 2 electron donor; $Cp*Ta(PMe_3)(C_2H_4)(CHCMe_3)$; $Cp_2TaMe(CH_2)$; $Cp(MeCp)TaMe(CH_2)$; $Cp_2TaMe(CHR)$, where R is H, Me, Ph, $SiMe_3$, or any other negatively charged 2 electron donor; $Cp_2Ta(CHPh_2)(CHCMe_3)$; $Cp_2Ta(CH_2Ph)(CHPh)$; $Cp*TaMe_3Ph$; $Cp*TaMe_2(Me_2CO)$; $Cp*TaMe_2(C_2H_4)$; $Cp_2TaMe_3$; $Cp_2TaPh_2$; $Cp*TaMe_4$; $Cp_2Ta(Cp)_2$; $Cp'Me_2Ta$ (indenyl); $Cp_2TaH(CH_2=CHR)$, where R is Me, Et, nPr, or any other negatively charged 2 electron donor; $Cp_2Ta(cyclopentene)$; $Cp_2Ta(benzyl)(CHPh)$; $Cp_2ClTaCH(tBu)$; $CpTa(CH(tBu)X(PMe_3)_2$, where X is H, Me, Et, Pr, halide, or Ph; $Cp_2TaMe(C_2H_4)$; $CH_2=Ta(Cp)_2CH_3$; $Cp_2Ta(nPr)(C_8H_8)$; $CpTa(CO)_x(PhCCPh)$, where x equals 1 or 2; $Cp_2Ta(allyl)$; $Cp_2Ta(methallyl)$; $Cp'TaH_3$; $Cp_2TaH(CO)$; $Cp_2TaH(propene)$; $Cp_2TaMe_3$; $Cp*TaCO_4$; $Cp*TaMe_4$; $Cp_2Ta(nPr)(CNMe)$; $Cp*TaMe_2(benzene)$; $Cp*Ta(CHCMe_3)(ethene)PMe_3$; $Ta(CO)_3(C_7H_7)$; $Ta_2(CO)_{12}$; $TaH(CO)_2(Dmpe)_2$; $TaX(CO)_2[Me_2P(CH_2)_2PR_2]_2$, where X is Cl, I, or any other negatively charged 2 electron donor and R is Et, iPr, or any other negatively charged 2 electron donor; $(RHg)Ta(CO)_4$, where R is Et, Ph, or any other negatively charged 2 electron donor; $Ph_3SnTa(CO)_4$; $[(C_5H_4nBu)Ta(CO)_3\{Si(Cl_8H_{37})_2\}]_2$; $((CH_3)_3CCH_2)_3Ta=CHC(CH_3)_3$; $((R_{1a}CR_{2a}R_{3a})((R_{1b}CR_{2b}R_{3b})((R_{1c},CR_{2c}R_{3c})Ta=CR_4R_5$ where $R_n$ is H, Me, Et, iPr, nPr, tBu, sBu, iBu, nBu, amyl, F, Cl, Br, I, or any other negatively charged 2-electron donor; $Ta(allyl)_4$; $Ta(1\text{-methyallyl})(C_4H_6)_2$; or $TaMe_5$.

10. The method of claim 1, wherein the pulsing of the plasma into the reaction chamber comprises pulsing the plasma when the plasma is already inside the chamber.

* * * * *